United States Patent
Hoffmann et al.

(10) Patent No.: US 10,284,292 B2
(45) Date of Patent: May 7, 2019

(54) SYSTEMS AND METHODS FOR COMMUNICATION LINK REDUNDANCY FOR DISTRIBUTED ANTENNA SYSTEMS

(71) Applicant: Andrew Wireless Systems GmbH, Buchdorf (DE)

(72) Inventors: Jaroslav Hoffmann, Donauwörth (DE); Peter Starek, Donauwoerth (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

(21) Appl. No.: 15/904,843

(22) Filed: Feb. 26, 2018

(65) Prior Publication Data

US 2018/0351641 A1 Dec. 6, 2018

Related U.S. Application Data

(60) Provisional application No. 62/512,489, filed on May 30, 2017.

(51) Int. Cl.
*H04B 17/309* (2015.01)
*H04B 10/079* (2013.01)
(Continued)

(52) U.S. Cl.
CPC ....... *H04B 10/07953* (2013.01); *G01M 11/00* (2013.01); *G01R 31/021* (2013.01);
(Continued)

(58) Field of Classification Search
CPC ........ H04B 10/07953; H04B 10/07955; H04B 10/25758; H04Q 11/0067; H04Q 2011/0081; H04Q 2011/0083
(Continued)

(56) References Cited

U.S. PATENT DOCUMENTS

| | | | |
|---|---|---|---|
| 9,425,893 B1* | 8/2016 | Srinivasan | ........... H04B 10/032 |
| 2007/0264009 A1 | 11/2007 | Sabat, Jr. et al. | |
| 2007/0280696 A1* | 12/2007 | Beaver | ............... H04Q 11/0067 |
| | | | 398/140 |
| 2008/0063411 A1* | 3/2008 | Lekkas | ............ H04B 10/25758 |
| | | | 398/187 |

(Continued)

FOREIGN PATENT DOCUMENTS

| EP | 0544989 A1 | 6/1993 |
|---|---|---|
| EP | 1025680 A2 | 8/2000 |

OTHER PUBLICATIONS

"Optical Fiber Redundancy by ION-M Systems", CommScope, Inc., Jul. 2015, pp. 1-8, CommScope.com.

(Continued)

*Primary Examiner* — Don N Vo
(74) *Attorney, Agent, or Firm* — Fogg & Powers LLC

(57) ABSTRACT

In one embodiment, a distributed antenna system comprises: at least one master unit; at least one remote antenna unit communicatively coupled via a switch to the master unit by a primary cable and a secondary cable both coupled to the switch, the remote antenna unit comprising a compensating link check module that outputs a control signal to the switch, wherein the switch selects between the primary and secondary cable in response to the control signal; wherein the compensating link check module controls the switch to momentarily select the secondary cable to perform a link check during which the remote unit measures a quality metric of a downlink signal received via the secondary cable; and upon initiation of the link check, the compensating link check module adjusts an attenuation of the downlink signal received on the secondary cable by loading calibration settings for the secondary cable into a compensation attenuator.

25 Claims, 9 Drawing Sheets

(51) Int. Cl.
  *H04B 10/2575* (2013.01)
  *H04Q 11/00* (2006.01)
  *G01M 11/00* (2006.01)
  *G01R 31/02* (2006.01)
  *H04B 17/00* (2015.01)
  *H04W 24/08* (2009.01)
  *H04W 88/08* (2009.01)

(52) U.S. Cl.
  CPC ..... *H04B 10/079* (2013.01); *H04B 10/07955* (2013.01); *H04B 10/25752* (2013.01); *H04B 10/25758* (2013.01); *H04B 17/00* (2013.01); *H04Q 11/0067* (2013.01); *H04W 24/08* (2013.01); *H04W 88/085* (2013.01); *H04Q 2011/0081* (2013.01); *H04Q 2011/0083* (2013.01)

(58) Field of Classification Search
  USPC .......................................................... 398/28
  See application file for complete search history.

(56) References Cited

U.S. PATENT DOCUMENTS

2013/0045010 A1\* 2/2013 Mukai ................... H04B 10/07
                                                     398/52
2016/0135184 A1  5/2016 Zavadsky et al.
2016/0295431 A1 10/2016 Henry et al.

OTHER PUBLICATIONS

International Searching Authority, "Invitation to Pay Additional Fees from PCT Application No. PCT/EP2018/064193 dated Aug. 21, 2018", from Foreign Counterpart to U.S. Appl. No. 15/904,843, filed Aug. 21, 2018, pp. 1-14, Published: EP.

International Searching Authority, "International Search Report and Written Opinion from PCT Application No. PCT/EP2018/064193 dated Oct. 16, 2018", from Foreign Counterpart to U.S. Appl. No. 15/904,843, filed Oct. 16, 2018, pp. 1-21, Published: EP.

\* cited by examiner

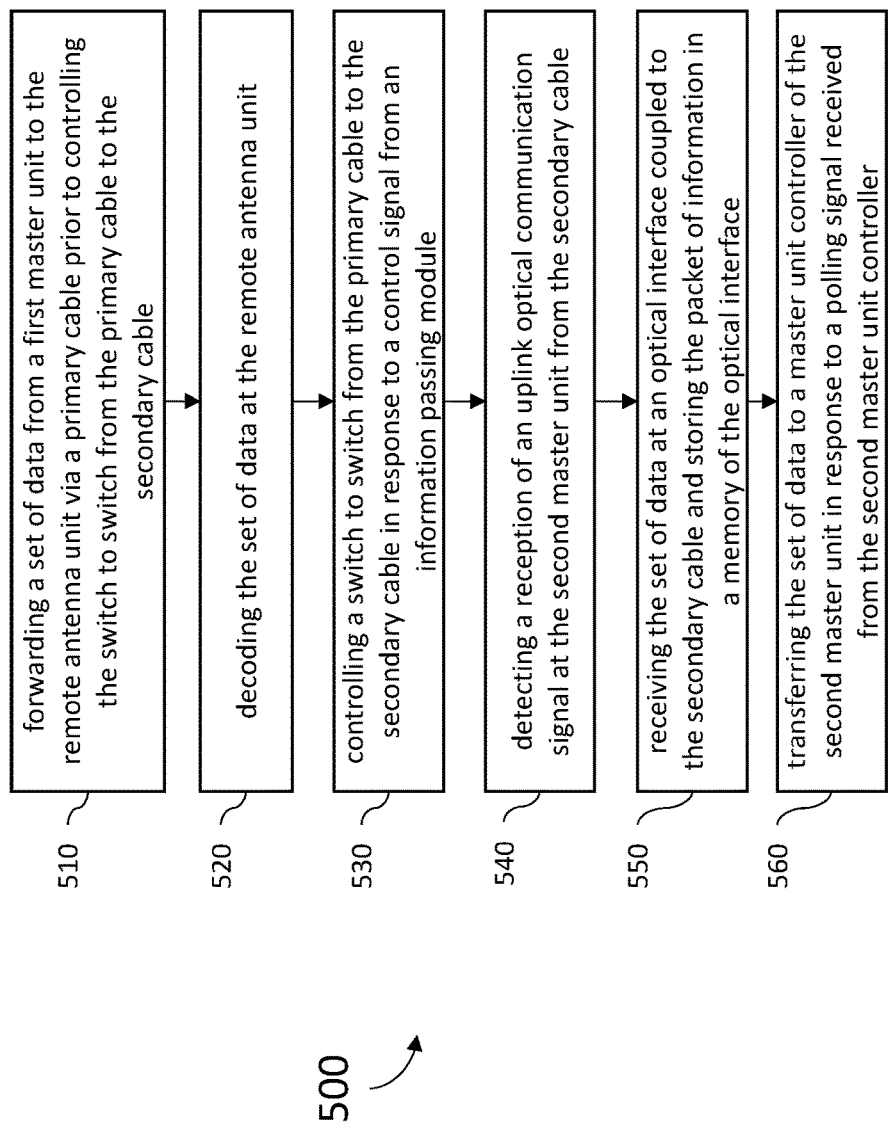

SYSTEMS AND METHODS FOR COMMUNICATION LINK REDUNDANCY FOR DISTRIBUTED ANTENNA SYSTEMS

CROSS-REFERENCE TO RELATED APPLICATIONS

This application is a U.S. Patent Application claiming priority to, and the benefit of, U.S. Provisional Patent Application No. 62/512,489, titled "SYSTEMS AND METHODS FOR COMMUNICATION LINK REDUNDANCY FOR DISTRIBUTED ANTENNA SYSTEMS" filed on May 30, 2017, and which is incorporated herein by reference.

BACKGROUND

A Distributed Antenna System (DAS) typically includes one or more master units that are communicatively coupled with a plurality of remote antenna units, where each remote antenna unit can be coupled directly to one or more of the master units or indirectly via one or more other remote antenna units and/or via one or more intermediary or expansion units. A DAS is typically used to improve the coverage provided by one or more base stations that are coupled to the master units. These base stations can be coupled to the master units via one or more cables or via a wireless connection, for example, using one or more donor antennas. The wireless service provided by the base stations can included commercial cellular service and/or private or public safety wireless communications.

When planning for coverage of tunnels, buildings, train stations, airports, stadiums and similar facilities that present public safety challenges and concerns, maintaining DAS communications coverage in the facility during emergency events is an important consideration. For that reason, DAS operators may be required to provide remote antenna units with connections to their master units using two redundant cables (for example, optical fibers) laid through two different, spatial separated, independent areas. For example, one way to address this need is through optical link redundancy (OLR), which provides a fully redundant link between the master and remote antenna units in addition to the main optical fiber link. OLR provides for two completely redundant optical links, not only redundant optical fibers but also redundant optical transceivers at both the master unit and remote antenna unit sites.

However, for public safety operators, this redundant and expensive equipment remains dormant most of the time, except for when emergency situations require its operation.

SUMMARY

In one embodiment, a distributed antenna system comprises: at least one master unit configured to receive a base station downlink radio frequency signal and to transmit a base station uplink radio frequency signal; at least one remote antenna unit that is communicatively coupled via a switch to the at least one master unit by a primary cable and a secondary cable both coupled to the switch, the remote antenna unit comprising a power amplifier and configured to radiate a remote downlink radio frequency signal from at least one antenna associated with the remote antenna unit, the remote antenna unit further configured to receive a remote uplink radio frequency signal from at least one antenna associated with the remote antenna unit; and a compensating link check module that outputs a control signal to the switch, wherein the switch selects between the primary cable and the secondary cable in response to the control signal; wherein the compensating link check module is configured to control the switch to momentarily select the secondary cable to perform a link check of the secondary cable, wherein during the link check of the secondary cable the remote unit measures at least one quality metric of a downlink signal received from the at least one master unit via the secondary cable; and wherein upon initiation of the link check of the secondary cable, the compensating link check module adjusts an attenuation of the downlink signal received on the secondary cable by loading a set of calibration settings for the secondary cable into a downlink compensation attenuator.

DRAWINGS

FIG. 5 is a flow chart illustrating a method of one embodiment of the present disclosure.

In accordance with common practice, the various described features are not drawn to scale but are drawn to emphasize. Reference characters denote like elements throughout figures and text.

DETAILED DESCRIPTION

In the following detailed description, reference is made to the accompanying drawings that form a part hereof, and in which is shown by way of specific illustrative embodiments. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Embodiments of the present disclosure present solutions for DAS operators that provide redundant paths for connectivity to remote antenna units without the need to provide redundant transceiver interfaces for the main cable and the substitute cable. Instead, as shown in the several example embodiments below, a DAS may incorporate a single cable transceiver interface at the master unit and remote antenna units, along with a compensating link check function that momentarily switches the active signal path from the primary cable to the substitute cable in order to validate that the substitute cable is viable. The compensating link check function is referred to here as "compensating" because it also reconfigures the cable transceiver interfaces at either the remote antenna unit, master unit, or both, in order to address differences in path losses that could cause the signal received from the secondary path to overdrive a power amplifier, or other sensitive equipment, in the remote antenna unit.

Figure 1:
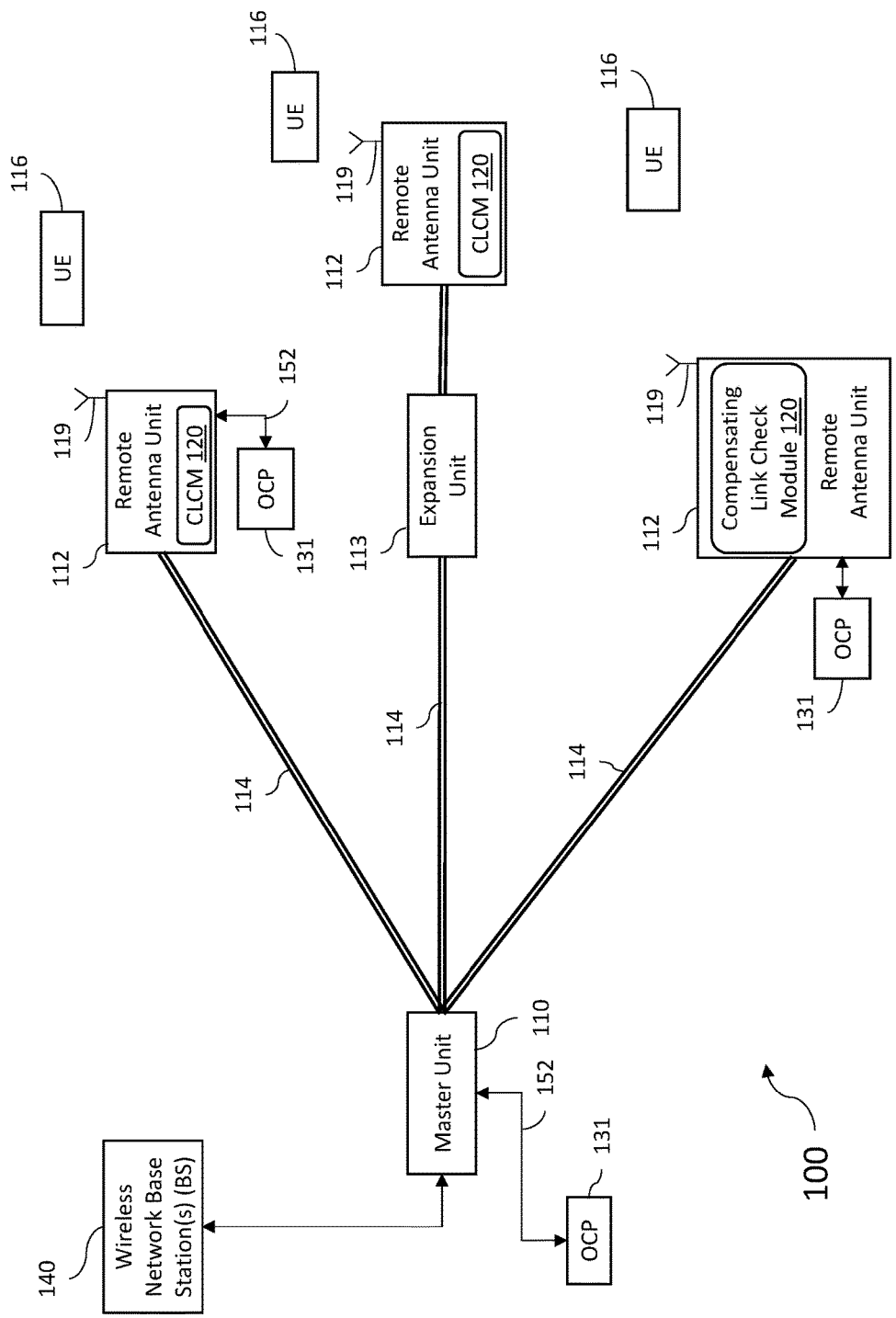
FIGS. 1, 1A, 1B and 1C are block diagrams illustrating an example distributed antenna system of one embodiment of the present disclosure.

FIG. 1 is a block diagram of one exemplary embodiment of a distributed antenna system (DAS) 100 where the remote antenna units utilize a compensating link check function as described herein. As shown in FIG. 1, the DAS 100 comprises one or more master units 110 that are communicatively coupled to one or more remote antenna units 112 via one or more cable pairs 114, each pair 114 further comprising a main (or "primary") cable and a parallel coupled substitute (or "secondary") cable that can serve as a backup to maintain connectivity from a master unit 110 to the remote antenna unit 112 in the event that the primary cable becomes degraded or faulted. Each remote antenna unit 112 can be communicatively coupled directly to one or more of the master units 110 or indirectly via one or more other remote antenna units 112 and/or via one or more intermediary or expansion units 113.

Each master unit 110 is communicatively coupled to one or more base stations 140. One or more of the base stations 140 can be co-located with the respective master units 110 to which it is coupled (for example, where the base station 140 is dedicated to providing base station capacity to the DAS 100 and is coupled to the respective master units 110). Also, one or more of the base stations 140 can be located remotely from the respective master units 110 to which it is coupled (for example, where the base station 140 provides base station capacity to an area beyond the coverage area of the DAS 100). In this latter case, the master unit 110 can be coupled to a donor antenna and repeater or bi-directional amplifier in order to wirelessly communicate with the remotely located base station 140.

In this exemplary embodiment, the base stations 140 include one or more base stations that are used to provide public and/or private safety wireless services (for example, wireless communications used by emergency services organizations (such as police, fire and emergency medical services) to prevent or respond to incidents that harm or endanger persons or property). Such base stations are also referred to here as "safety wireless service base stations" or "safety base stations." The base stations 140 also can include, in addition to safety base stations, one or more base stations that are used to provide commercial cellular wireless service. Such base stations are also referred to here as "commercial wireless service base stations" or "commercial base stations."

The base stations 140 can be coupled to the master units 110 using a network of attenuators, combiners, splitters, amplifiers, filters, cross-connects, etc., (sometimes referred to collectively as a "point-of-interface" or "POI"). This network can be included in the master units 110 and/or can be separate from the master units 110. This is done so that, in the downlink, the desired set of RF channels output by the base stations 140 can be extracted, combined, and routed to the appropriate master units 110, and so that, in the upstream, the desired set of carriers output by the master units 110 can be extracted, combined, and routed to the appropriate interface of each base station 140. It is to be understood, however, that this is one example and that other embodiments can be implemented in other ways.

Figure 1B:
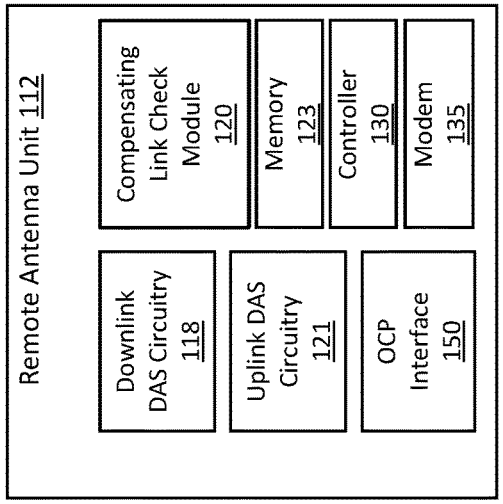
Figure 1D:
FIG. 1D illustrates an optional configuration for primary and secondary cables of one embodiment of the present disclosure.
Figure 1A:
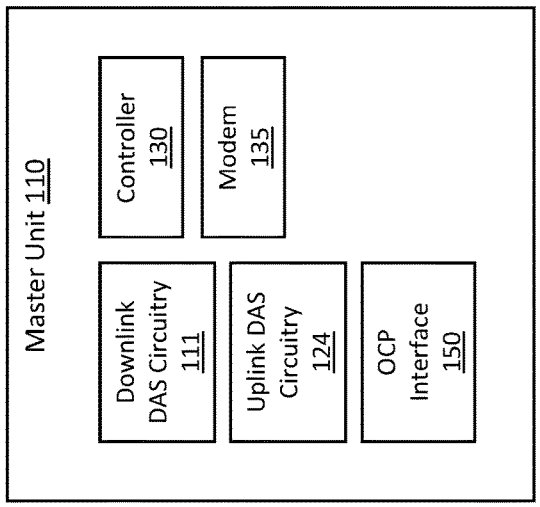

As shown in FIG. 1A, in general, each master unit 110 comprises downlink DAS circuitry 111 that is configured to receive one or more downlink signals from one or more base stations 140. These signals are also referred to here as "base station downlink signals." Each base station downlink signal includes one or more radio frequency channels used for communicating in the downlink direction with user equipment (UE) 116 (such as tablets or cellular telephone, for example) over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORP") protocol, the Open Base Station Standard Initiative ("OBSAI") protocol, or other protocol). The downlink DAS circuitry 111 in each master unit 110 is also configured to generate one or more downlink transport signals derived from one or more base station downlink signals and to transmit one or more downlink transport signals to one or more of the remote antenna units 112.

As shown in FIG. 1B, each remote antenna unit 112 comprises downlink DAS circuitry 118 that is configured to receive the downlink transport signals transmitted to it from one or more master units 110 and to use the received downlink transport signals to generate one or more downlink radio frequency signals that are radiated from one or more antennas 119 associated with that remote antenna unit 112 for reception by user equipment 116. These downlink radio frequency signals are analog radio frequency signals and are also referred to here as "remote downlink radio frequency signals." Each remote downlink radio frequency signal includes one or more of the downlink radio frequency channels used for communicating with user equipment 116 over the wireless air interface. In this way, the DAS 100 increases the coverage area for the downlink capacity provided by the base stations 140.

Also, each remote antenna unit 112 comprises uplink DAS circuitry 121 that is configured to receive via antenna 119 one or more uplink radio frequency signals transmitted from the user equipment 116. These signals are analog radio frequency signals and are also referred to here as "remote uplink radio frequency signals." Each uplink radio frequency signal includes one or more radio frequency channels used for communicating in the uplink direction with user equipment 116 over the relevant wireless air interface. The uplink DAS circuitry 121 in each remote antenna unit 112 is also configured to generate one or more uplink transport signals derived from the one or more remote uplink radio frequency signals and to transmit one or more uplink transport signals to one or more of the master units 110.

Each master unit 110 comprises uplink DAS circuitry 124 that is configured to receive the respective uplink transport signals transmitted to it from one or more remote antenna units 112 and to use the received uplink transport signals to generate one or more base station uplink radio frequency signals that are provided to the one or more base stations 140 associated with that master unit 110. Typically, this involves, among other things, combining or summing uplink signals received from multiple remote antenna units 112 in order to produce the base station signal provided to each base station 140. Each base station uplink signal includes one or more of the uplink radio frequency channels used for communicating with user equipment 116 over the wireless air interface. In this way, the DAS 100 increases the coverage area for the uplink capacity provided by the base stations 140.

Figure 1C:
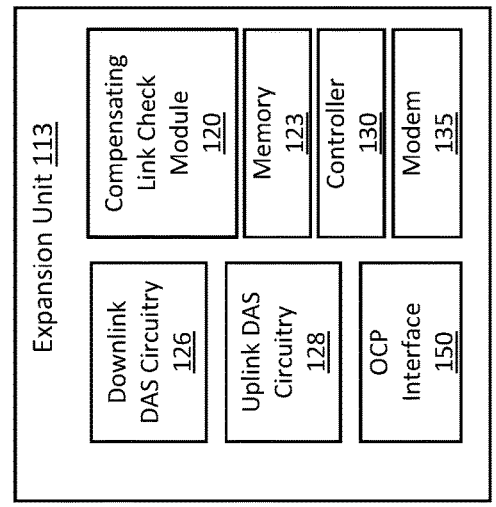

As shown in FIG. 1C, each expansion unit 113 comprises downlink DAS circuitry 126 that is configured to receive the downlink transport signals transmitted to it from the master unit 110 (or other expansion unit 113) and transmits the downlink transport signals to one or more remote antenna units 112 or other downstream expansion units 113. Each expansion unit 113 comprises uplink DAS circuitry 128 that is configured to receive the respective uplink transport signals transmitted to it from one or more remote antenna units 112 or other downstream expansion units 113, combine or sum the received uplink transport signals, and transmit the combined uplink transport signals upstream to the master unit 110 or other expansion unit 113. In some embodiments, one or more remote antenna units 112 may be coupled to the one or more master units 110 via one or more other remote antenna units 112 (for examples, where the remote antenna units 112 are coupled together in a daisy chain or ring topology). In such an embodiments, an expansion unit 113 may be implemented using a remote antenna units 112.

The downlink DAS circuitry 111, 118, and 126 and uplink DAS circuitry 124, 121, and 128 in each master unit 110, remote antenna unit 112, and expansion unit 113, respectively, can comprise one or more appropriate connectors, attenuators, combiners, splitters, amplifiers, filters, duplexers, analog-to-digital converters, digital-to-analog converters, mixers, field-programmable gate arrays (FPGAs), microprocessors, transceivers, framers, etc., to implement the features described above. Also, the downlink DAS circuitry 111, 118, and 126 and uplink DAS circuitry 124, 121, and 128 may share common circuitry and/or components. For example, some components (such as duplexers) by their nature are shared among the downlink DAS circuitry 111, 118, and 126 and uplink DAS circuitry 124, 121, and 128.

The DAS 100 can use either digital transport, analog transport, or combinations of digital and analog transport for generating and communicating the transport signals between the master units 110, the remote antenna units 112, and any expansion units 113. For the purposes of illustration, some of the embodiments described here are implemented using analog transport over optical cables. However, it is to be understood that other embodiments can be implemented in other ways, for example, in DASs that use other types of analog transport (for example, using other types of cable and/or using analog transport that makes use of frequency shifting), digital transport (for example, where digital samples indicative of the analog base station radio frequency signals and analog remote radio frequency signals are generated and communicated between the master units 110 and the remote antenna units 112), or combinations of analog and digital transport.

Each unit 110, 112, 113 in the DAS 100 can also comprises a respective controller 130. The controller 130 is implemented using one or more programmable processors that execute software that is configured to implement the various features described here as being implemented by the controller 130. The controller 130, the various features described here as being implemented by the controller 130, or portions thereof, can be implemented in other ways (for example, in a field programmable gate array (FPGA), application specific integrated circuit (ASIC), etc.).

Each controller 130 is configured to monitor and control the operation of the associated unit. Each controller 130 is also configured to send and receive management data over the DAS 100. In one embodiment, each unit 110, 112, 113 in the DAS 100 also comprises a modem 135 that is configured to send and receive management data over the DAS 100 by modulating and demodulating one or more carrier frequencies that are used for the purpose of communicating management data. In some embodiments (for example, where digital transport is used in the DAS), a separate modem 135 for modulating and demodulating management data is not used and, instead, the management data is combined with the digital DAS transport data before being supplied to the transport transceiver or other physical layer device.

One or more of the units 110, 112, 113 in the DAS 100 also comprise an interface 150 to couple the controller 130 in that unit 110, 112, 113 to an operator control panel 131 that is deployed near that unit 110, 112, 113. The interface 150 is therefore also referred to here as an "OCP interface 150." Each such unit 110, 112, 113 can include an appropriate connector to attach a cable 152 (also referred to here as an "OCP cable 152") that is used to couple the unit 110, 112, 113 to the OCP 131. In general, each OCP 131 can be connected to the nearest unit 110, 112, 113 of the DAS 110.

In some embodiments, the primary and secondary cables discussed herein may each operate bidirectionally with downlink and uplink communications carried over the cable. It should also be understood, however, that in other embodiments, the primary cable may itself further comprise a pair of cables including an uplink cable for uplink communication, and a downlink cable for downlink communication, as shown in FIG. 1D. Similarly, the secondary cable may itself further comprise a pair of cables including an uplink cable for uplink communication, and a downlink cable for downlink communication also as shown in FIG. 1E. In such a configuration, there would therefore be a total of four cables (a primary pair in cable 114-P and a secondary pair in cable 114-S) coupling each remote antenna unit 112 to a master unit 110.

As mentioned above, in addition to potentially providing commercial connectivity to users via consumer bands, DAS 110 also distributes public safety connectivity coverage and private safety communication coverage. In the exemplary embodiment shown in FIG. 1, each remote unit 112 includes a compensating link check module 120 that monitors the integrity of a substitute cable path from the master unit, as further described below.

Compensating link check module 120, the various features described here as being implemented by compensating link check module 120, and/or portions thereof, can be implemented by circuits comprising electronics in combination with for example, control circuitry and/or code executed by a processor, in a field programmable gate array (FPGA), an application specific integrated circuit (ASIC), or the like. In some embodiments, the compensating link check module 120 may be implemented with electronics responsive to signals from the remote unit controller 130. In some embodiments, the compensating link check module 120 may be implemented at least in part as a software application executed by the controller 130.

Figure 2:
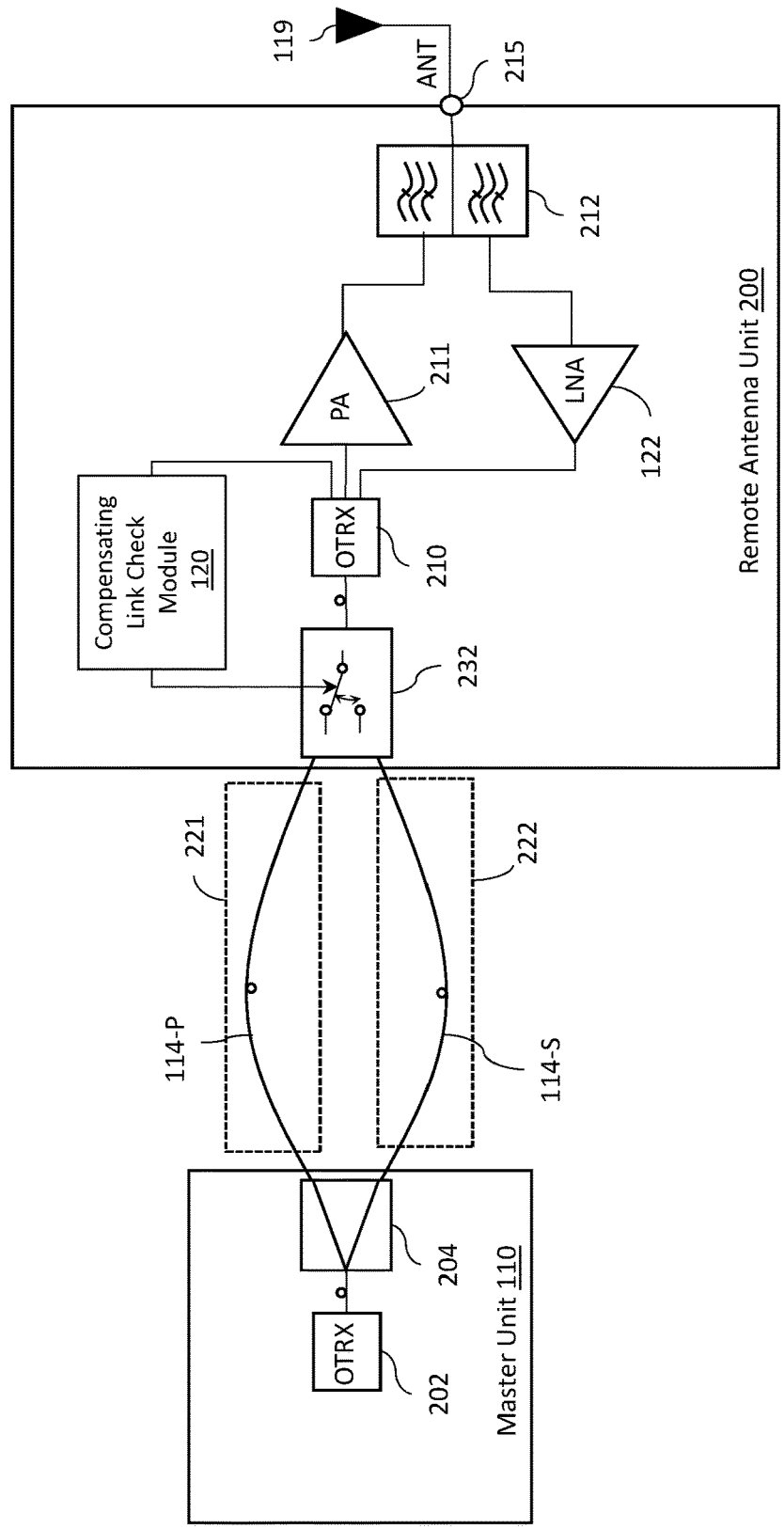
FIG. 2 is a block diagram illustrating an example master unit coupled to a remote antenna a compensating link check module of one embodiment of the present disclosure.

FIG. 2 is a simplified diagram illustrating remote antenna unit 200 of one embodiment of the present disclosure that may be used to implement any one of the remote units 112 of the DAS 100 described above in connection with FIG. 1 and operate in conjunction with the master unit 110 shown in FIG. 1. In the particular embodiment shown in FIG. 2, remote antenna unit 200 comprises an optical transceiver interface (OTRX) 210 for communicating via optical fiber with the master unit 110 and an optical switch 232 coupled between the OTRX 210 and the primary and secondary optical fiber cables (114-P and 114-S) through which the remote antenna unit 200 communicates with the master unit 110. It should be appreciated that in other embodiments, the master unit 110 and remote unit 200 may communicate over other types of wiring or cables. Remote antenna unit 200 further comprises an RF power amplifier 211, a duplexer 212, an antenna port 215 that is configured to couple the remote antenna unit 200 an antenna 119, a low noise amplifier (LNA) 122, and a compensating link check module 120. Power amplifier 211 power amplifies downlink signals to a desired power level and feeds it to antenna 119 to radiate to user equipment 116 (not shown in FIG. 2) via duplexer 212. Uplink radio frequency signals transmitted from user equipment 116 in the coverage area of the remote antenna unit 200 are received via the associated antenna 119 and provided to LNA 122, which amplifies the received uplink signals. The remote antenna unit 200 can also include one or more of band-pass filters (not shown) to filter out signals having frequencies outside of the bands in which the remote antenna unit 112 is licensed to operate. As such, though the power amplifier 211 may output a broad range of amplified signals, only those signals in frequency bands for which DAS 100 is authorized to transmit will pass to the antenna port 215 and radiate from antenna 119. Similarly, the remote antenna unit 200 can also include one or more of band-pass filters (not shown) configured to pass to the LNA 122 only the signals in the relevant uplink frequency bands without permitting high power downlink signals to pass and saturate the uplink path electronics of the remote antenna unit 200.

In the embodiment shown in FIG. 2, the remote antenna unit 200 is coupled to the master unit 110 by two separate cables which are routed through two diverse paths. The primary, or main cable 114-P is laid along a first path 221 while the secondary, or substitute cable 114-S is laid along a second path 222 that is physically separated from the first path 221. For example, the first path 221 may comprise a first set of rooms, corridors, hallways, tunnels, cable trays, etc., that are completely distinct from those of the second path 222. In this way, if there is a fire, structural collapse, or other catastrophic event along the first path 221 that damages the primary cable 114-P, the physical separation of the second path 222 from the first path 221 may allow the secondary cable 114-S to survive and remain functional. The master unit 110 includes an optical transceiver interface 202 coupled to an optical splitter-combiner 204 that comprises separate ports coupled to the primary cable 114-P and secondary cable 114-S. Downlink communication signals output from the optical transceiver interface 202 are split into to duplicate optical signals, one applied to primary cable 114-P and the other applied to the secondary cable 114-S. In the upstream direction, uplink optical communication signals received from either the primary cable 114-P or the secondary cable 114-S are passed up to the optical transceiver interface 202 and processed by the master unit 110 as described above. Because only one of the primary cable 114-P or the secondary cable 114-S will ever be active at any one time, processing to deal with two concurrent uplink communication signals from the remote unit 200 at the splitter-combiner 204 is not necessary.

In the remote antenna unit 200, the primary cable 114-P and secondary cable 114-S are switchably coupled to the optical transceiver interface 210 via the optical switch 232 such that only one of the two cables 114-P or 114-S is actively coupled to the optical transceiver interface through a complete signal path at any one time. That is, under normal operating conditions, optical switch 232 is switched to a first state where the primary cable 114-P is actively coupled to the optical transceiver interface 210 and uplink and downlink communications between the master unit 110 and the remote antenna unit 200 are carried by the primary cable 114-P. When a degradation is detected in the signal being carried by the primary cable 114-P (for example, a loss or other attenuation of signal power below a threshold or an increase in other detectable errors), the optical switch 232 may be switched to a second state where the secondary cable 114-S becomes actively coupled to the optical transceiver interface 210 instead of the primary cable 114-P so that uplink and downlink communications between the master unit 110 and the remote antenna unit 112 are carried by the secondary cable 114-S. Two separate communication paths are thus provided to the remote antenna unit 112 from a master unit.

It should be noted however that during periods when the primary cable 114-P is actively coupled to the optical transceiver interface 210 instead of the second cable 114-S (which is most of the time given that the function of the secondary cable 114-S is as a backup for the primary cable 114-P) the downlink signal received via the secondary cable 114-S is not coupled to the optical transceiver interface 210 and thus is not actively monitored as received at the remote antenna unit 200. If something were wrong with the secondary cable 114-S, that defect would not be identified until the secondary cable 114-S is actively coupled to the optical transceiver interface 210 instead of the primary cable 114-P.

For this reason, remote antenna units 200 each comprise the compensating link check module 120, which periodically operates the switch 232 to swap the input of the remote antenna unit's optical transceiver interface between the primary and secondary cables feeding the remote antenna unit on a configurable basis. As shown in FIG. 2, the compensating link check module 120 is coupled to the optical switch 232 and the optical transceiver interface 210. In some embodiments, the compensating link check module 120 may be implemented at least in part as a software application stored in a memory 123 coupled to, and executed by, the controller 130.

Normally, the optical signal received at the optical switch 232 will comprise the signal from the optical splitter-combiner 204 of master unit 110 that was carried by the primary cable 114-P routed along the first path 221. In order to initiate a link check of the secondary cable 114-S, the compensating link check module 120 controls the optical switch 232 to momentarily decouple the primary cable 114-P from the input of the optical transceiver interface 210 and couple the secondary cable 114-S to the optical transceiver interface 210. In one embodiment, the duration of this link check may be on the order of 500 milliseconds, for example. During this momentary period, the optical signal received at the optical switch 232 will instead comprise the signal from the optical splitter-combiner 204 of master unit 110 that was carried by the secondary cable 114-S routed along the second path 222. This signal as received at the optical transceiver interface 210 can be measured to obtain quality metrics (such as signal power level, for example) that provide an indication as to whether the secondary cable 114-S remains non-degraded.

The result of the link check can then be communicated back upstream after the compensating link check module 120 switches the primary cable 114-P back into service. For example, in one implementation, if the signal quality of the optical signal received via secondary cable 114-S during the momentary link check is acceptable (that is, the measurement indicates that the signal meets acceptable thresholds for the quality metric) then after the compensating link check module 120 switches the primary cable 114-P back into service, the compensating link check module 120 can communicate a status message back to the master unit 110 that the secondary cable 114-S passed the link check. In one implementation, if the signal quality of the optical signal received via secondary cable 114-S during the momentary link check is not acceptable (that is, the measurement indicates that the signal does not meet acceptable thresholds for the quality metric) then after the compensating link check module 120 switches the primary cable 114-P back into service, the compensating link check module 120 can communicate a status message back to the master unit 110 that the secondary cable 114-S has failed the link check. The master unit 110 may then communicate an alarm message to the DAS 100 operator indicating that the secondary cable 114-S is in need of inspection and/or repair.

As mentioned above, in some embodiments, the primary cable 114-P and secondary cable 114-S may each further comprise two cables including a first cable for downlink communication and a second cable for uplink communication. The link check in that case may include a measurement of the downlink signal as received at the optical transceiver interface 210 via the downlink cable of the secondary cable 114-S, and a measurement of the uplink signal as received at the optical transceiver interface 204 via the uplink cable of the secondary cable 114-S.

It should be noted that it is highly desired for the gain between the optical transceiver interface 202 in the master unit 110 and the optical transceiver interface 210 in the remote unit 112 to be kept at a constant value in both the respective uplink and downlink directions independent from the optical loss of the cables 114. This may be achieved by adapting settable compensation attenuators in the RF paths of the optical transceiver interface modules 202 and 210. This gain may be controlled, for example, by the controller 130 of the master unit 110. For one example implementation, the compensation value is derived from the optical loss measured between the master unit 110 and the remote unit 112, as measured during regularly repeating measurement cycles. The power levels of the RF or optical signal are measured both at the interface modules 202 and 210, the difference between the two representing the optical loss of the optical fiber connection for that path. Based on these measurements, the compensation attenuators in the optical transceiver interface modules 202 and 210 are set to appropriate values to keep the optical link gain constant.

It should therefore further be noted that if the interface modules 202 and 210 compensation attenuators are set to values corresponding to the optical loss of the primary cable 114-P, those values will likely differ from values that would correspond to the optical loss of the secondary cable 114-S. If the secondary cable 114-S has a much lower optical loss than the primary cable 114-P, then during the performance of the link check when the switch 232 is switched to couple the secondary cable 114-S to the input of the optical transceiver interface 210, the excess power received at the optical transceiver interface 210 would lead to excessive RF power being supplied to the power amplifier 211 because the compensation attenuators would maintain the settings determined for use with the primary cable 114-P until a new gain measurement cycle is performed. The excessive RF power supplied to the power amplifier 211 has the potential to either cause damage to the power amplifier 211 or activation of protective functions in the power amplifier 211 resulting, for example, in the switching off of the power amplifier 211, which eventually would result in placing the remote antenna unit 112 out of service. For these reasons, at least one of the optical transceiver interfaces 202 or 210 stores two sets of calibration settings for the compensation attenuators. One set is associated with the particular loss characteristics of the primary cable 114-P and the other is associated with the loss characteristics of the secondary cable 114-S.

Figure 2A:
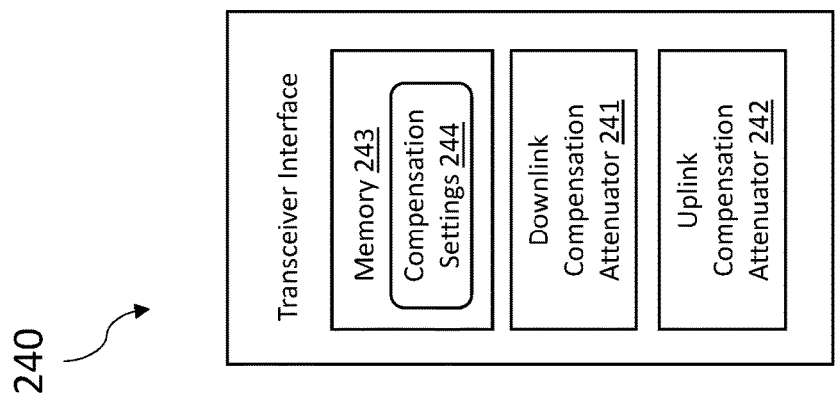
FIG. 2A is block diagram illustrating an example transceiver interface of one embodiment of the present disclosure.

FIG. 2A illustrates at 240 such a transceiver interface (which may comprise, for example, either of the optical transceiver interface modules 202 or 210). The transceiver interface 240 comprises a downlink compensation attenuator 241, uplink compensation attenuator 242, and a memory 243 for storing compensation settings 244 (which may be determined as described above). When a link check is initiated, the compensating link check module 120 signals the optical transceiver interface module 202 and/or 210 to load the set of calibration settings for the secondary cable 114-S from the stored compensation settings 244, and signals the optical switch 232 to toggle over to the secondary cable 114-S so that when the signal from the secondary cable 114-S is received by the optical transceiver interface module 210, the downlink compensation attenuator 241 is using the calibration settings associated with the secondary cable 114-S. When the link check is complete, the compensating link check module 120 signals the optical transceiver interface module 202 and/or 210 to load the set of calibration settings for the primary cable 114-P from the stored compensation settings 244, and signals the optical switch 232 to toggle back to the primary cable 114-P so that when the signal from the primary cable 114-P is again received by the optical transceiver interface module 210, the downlink compensation attenuator 241 is using the calibration settings associated with the primary cable 114-P.

Regarding the determination of when the compensating link check module 120 should initiate a link check, this may be based on several considerations. In some implementation, a link test may be scheduled to occur during periods when the link check is unlikely to affect any active communications. In other implementations, the compensating link check module 120 may periodically initiate the link check according to a recurring schedule, such as on an hourly basis, every few hours or daily basis, or at some other interval. In other implementations, the link check performed by compensating link check module 120 may be manually initiated by the DAS operator. Similarly, the occurrence of regularly scheduled link checks by the compensating link check module 120 may be enabled or disabled manually by the DAS operator.

For example, in various different embodiments, compensating link check module 120 responds to management data, which may be received by DAS 100 in multiple different ways. For example, in one embodiment, DAS 100 receives management data for initiating a link check through input entered by an operator via one of the OCPs 131 coupled to the master unit 110, an RAU 112, or an expansion unit 113. Status messages with the results of link checks may similarly be communicated to and displayed by an OCP 131. Alternatively, management data for initiating a link check may be communicated via one of the modems 135 used for the purpose of communicating management data. As another alternative, management data for initiating a link check may be received by the master unit 110 from one of the base stations 140. Management data comprising an instruction to initiating a link check may then be transmitted to the affected RAU 112. In response, the controller 130 in the RAU 112 activates the compensating link check module 120 to initiate the link check.

Figure 2B:
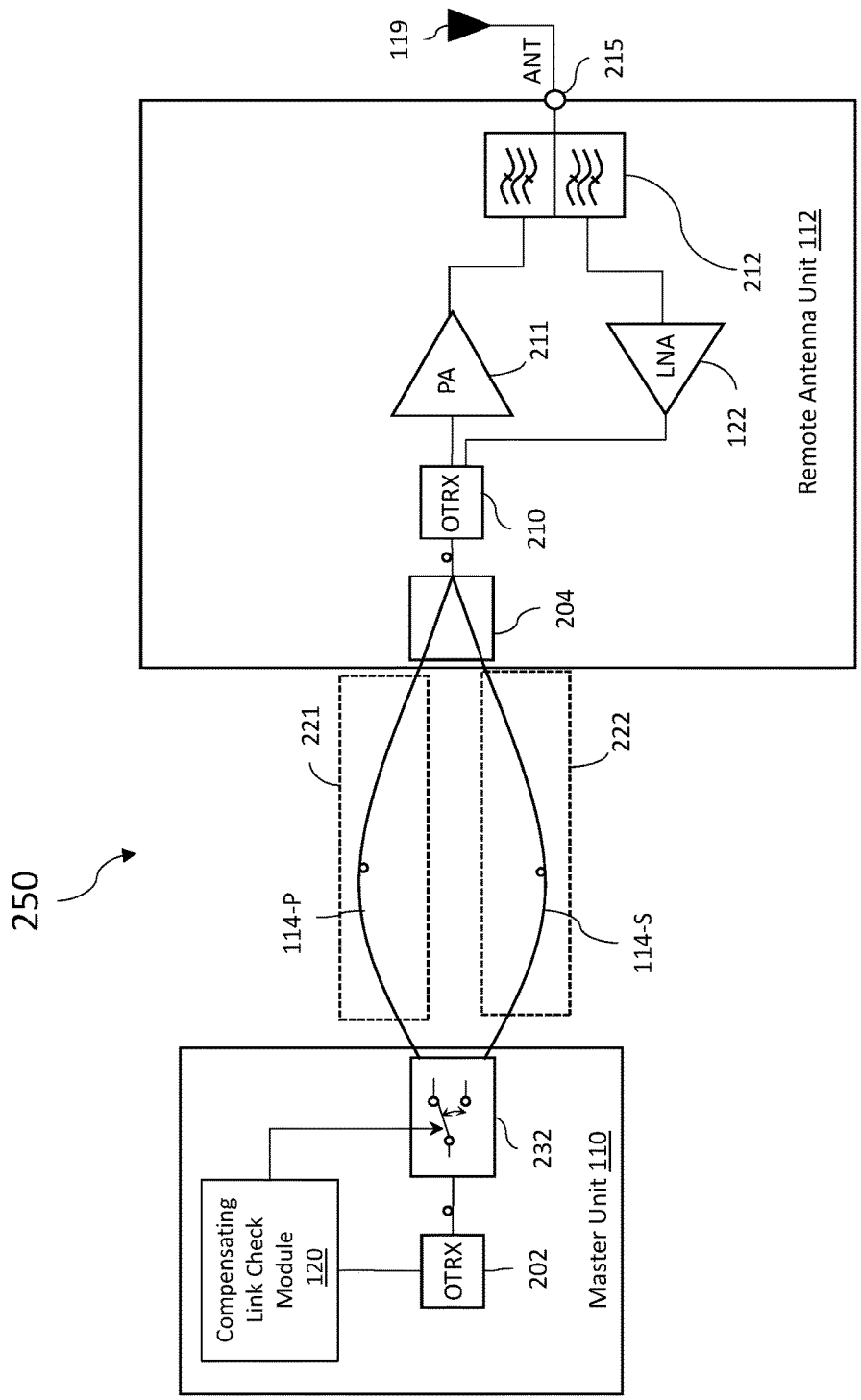
FIG. 2B is a block diagram illustrating an alternate example of a remote antenna coupled to a master unit a compensating link check module of one embodiment of the present disclosure.

One alternate configuration of the embodiment presented in FIG. 2 is illustrated in FIG. 2B at 250, where one or both of the compensating link check module 120 and switch 232 may be located in the master unit 110 and where the splitter-combiner 204 is relocated to the remote antenna unit 200. In operation, as opposed to the master unit always providing a downlink signal on both cables 114-P and 114-S and the switch 232 in the remote unit selecting which one is coupled to the optical transceiver interface 210, the remote unit optical transceiver interface 210 is continuously coupled to both cables 114-P and 114-S and the switch 232 (under control of the compensating link check module 230) selects which of the cables 114-P and 114-S becomes energized. Otherwise, these components operate together in the same manner to perform link checks of the secondary cable 114-S, while reconfiguring compensation attenuator settings, as set forth in any of the above disclosed examples.

Figure 3:
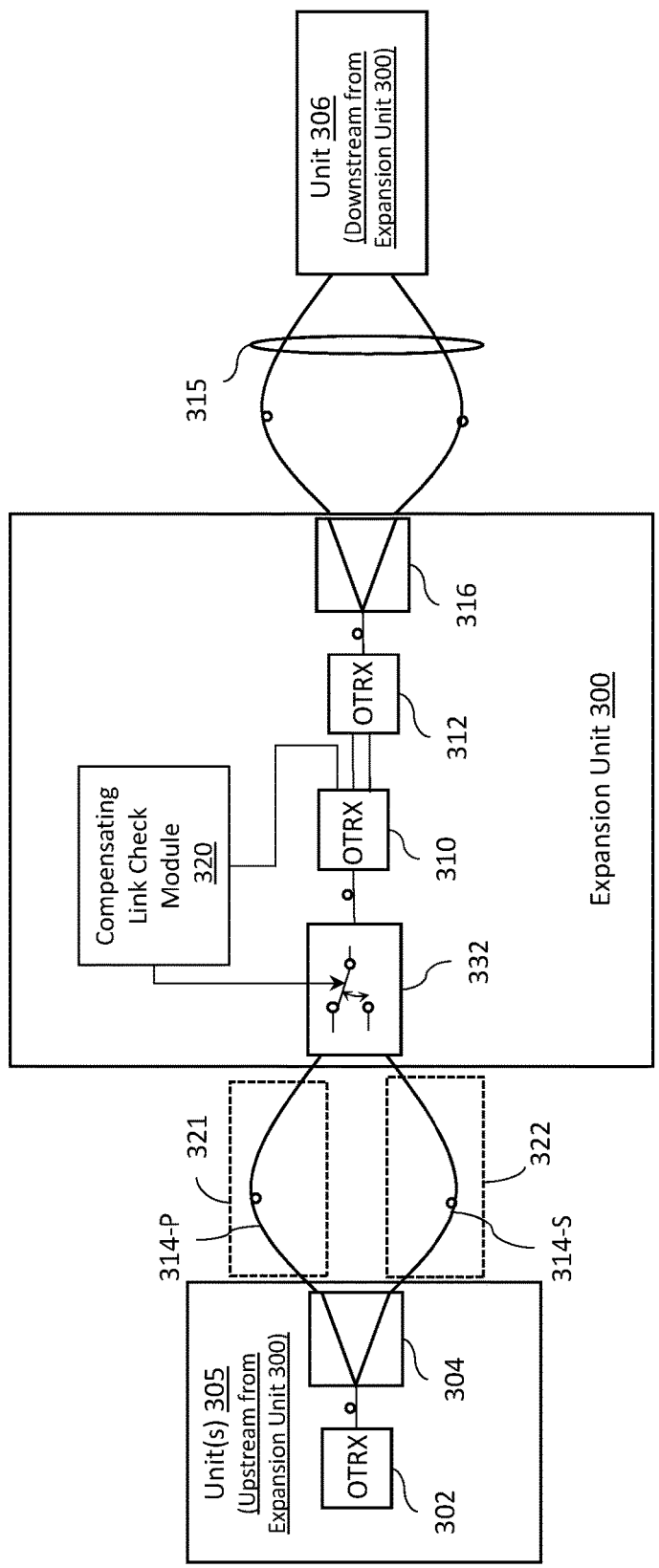
FIGS. 3 and 3A are diagrams illustrating example embodiments of an expansion unit of one embodiment of the present disclosure.

FIG. 3 is a simplified diagram illustrating an expansion unit 300 of one embodiment of the present disclosure which may be used to implement an expansion unit 113 of the DAS 100 described in FIG. 1. In the particular embodiment shown in FIG. 3, expansion unit 300 comprises an optical transceiver interface (OTRX) 310 for communicating via optical fiber with a unit 305 that is upstream from the expansion unit 300 (and which may comprise, for example, the master unit 110, or another expansion unit 300) and an optical switch 332 coupled between the optical transceiver interface 310 and a primary and secondary optical fiber cables (314-P and 314-S) through which the expansion unit 300 bidirectionally communicates with the unit 305.

In some embodiments, the primary and secondary cables 314-P and 314-S discussed herein may each operate bidirectionally with downlink and uplink communications carried over the cable. It should also be understood, however, that in other embodiments, the primary cable 314-P may itself further comprise a pair of cables including an uplink cable for uplink communication, and a downlink cable for downlink communication. Similarly, the secondary cable 314-S may itself further comprise a pair of cables including an uplink cable for uplink communication, and a downlink cable for downlink communication. In such a configuration, there would therefore be a total of four cables (a primary pair in cable 314-P and a secondary pair in cable 314-S) coupling the expansion unit 113 to the unit 305. It should also be appreciated that in other embodiments, the master unit 110 and remote unit 200 may communicate over other types of wiring or cables.

In the embodiment shown in FIG. 3, the expansion unit 300 is coupled to the unit 305 by two separate cables 314-P and 314-S, which are routed through two diverse paths. The primary, or main cable 314-P is laid along a first path 321 while the secondary, or substitute cable 314-S is laid along a second path 322 that is physically separated from the first path 321. For example, the first path 321 may comprise a first set of rooms, corridors, hallways, tunnels, cable trays, etc., that are completely distinct from those of the second path 322. In this way, if there is a fire, structural collapse, or other catastrophic event along the first path 321 that damages the primary cable 314-P, the physical separation of the second path 322 from the first path 321 may allow the secondary cable 314-S to survive and remain functional. The unit 305 includes an optical transceiver interface 302 coupled to an optical splitter-combiner 304 that comprises separate ports coupled to the primary cable 314-P and secondary cable 314-S. Downlink communication signals output from the optical transceiver interface 302 are split into to duplicate optical signals, one applied to primary cable 314-P and the other applied to the secondary cable 314-S. In the upstream direction, uplink optical communication signals received from either the primary cable 314-P or the secondary cable 314-S are passed up to the optical transceiver interface 302 and processed by the unit 305.

In the expansion unit 300, the primary cable 314-P and secondary cable 314-S are switchably coupled to the optical transceiver interface 310 via the optical switch 332 such that only one of the two cables is actively coupled to the optical transceiver interface through a complete signal path at any one time. That is, under normal operating conditions, optical switch 332 is switched to a first state where the primary cable 314-P is actively coupled to the optical transceiver interface 310 and uplink and downlink communications between the unit 305 and the expansion unit 300 are carried by the primary cable 314-P. When a degradation is detected in the signal being carried by the primary cable 314-P (for example, a loss or other attenuation of signal power below a threshold or increase in other detectable errors), the optical switch 332 may be switched to a second state where the secondary cable 314-S becomes actively coupled to the optical transceiver interface 310 instead of the primary cable 314-P so that uplink and downlink communications between the unit 305 and the expansion unit 300 are carried by the secondary cable 314-S.

Expansion unit 300 further comprises a compensating link check module 320 which periodically operates the switch 332 to switch the input of the remote antenna unit's optical transceiver interface between the primary and secondary cables feeding the remote unit on a configurable basis, in the same manner as described above with respect to the compensating link check module 120 of the remote unit 200. As shown in FIG. 3, expansion unit 300 may not itself include a power amplifier as was the case for remote unit 200 but instead includes a second optical transceiver interface 312 through which the expansion unit 300 bidirectionally communicates with at least one unit 306 that is downstream from the expansion unit 300 via at least one cable 315 (which may comprise either an optical or electrical cable medium). Cable 315 may itself further be comprised of a set of primary and secondary cables routed via diverse paths to the unit 306 that is downstream from the expansion unit 300, each of which are coupled to the expansion unit's second optical transceiver interface 312 via splitter-combiner 316.

As mentioned above, in some embodiments, the primary cable 314-P and secondary cable 314-S may each further comprise two cables including a first cable for downlink communication and a second cable for uplink communication. The link check in that case may include a measurement of the downlink signal as received at the optical transceiver interface 310 via the downlink cable of the secondary cable 314-S, and a measurement of the uplink signal as received at the optical transceiver interface 304 via the uplink cable of the secondary cable 314-S.

As was the case for the remote unit 200, if the secondary cable 314-S has a much lower optical loss than the primary cable 314-P, then during the performance of the link check when the switch 332 is operated to couple the secondary cable 314-S to the input of the optical transceiver interface 310, the excess power would be received at the optical transceiver interface 210. The excess power received at the optical transceiver interface 210 may lead to a corresponding increase in power passed downstream to the unit 306 that is downstream from the expansion unit 300 via cable 315, which in turn can result in excessive RF power supplied to a power amplifier in that unit. For this reasons, optical transceiver interfaces 310 (which may also be represented by the example optical transceiver interface 240 of FIG. 2A) may store two sets of calibration settings for its compensation attenuators. One set is associated with the particular loss characteristics of the primary cable 314-P and the other is associated with the loss characteristics of the secondary cable 314-S. When a link check is initiated, the compensating link check module 320 signals the optical transceiver interface module 304 and/or 310 to load the set of calibration settings for the secondary cable 314-S from the stored compensation settings 244, and signals the optical switch 332 to toggle over to the secondary cable 314-5 so that when the signal from the secondary cable 314-S is received by the optical transceiver interface module 310, the downlink compensation attenuator 241 is using the calibration settings associated with the secondary cable 314-S. When the link check is complete, the compensating link check module 320 signals the optical transceiver interface module 302 and/or 310 to reload the set of calibration settings for the primary cable 314-P from the stored compensation settings 344, and signals the optical switch 332 to toggle back to the primary cable 314-P so that when the signal from the primary cable 314-P is again received by the optical transceiver interface module 310, its downlink compensation attenuator 241 is using the calibration settings associated with the primary cable 314-P. It should be understood that the determination of when the compensating link check module 320 should initiate a link check (for example, either by manual or automatic processes) may be performed in any of the ways described above for a compensating link check module 120 of a remote antenna unit 112.

Figure 3A:
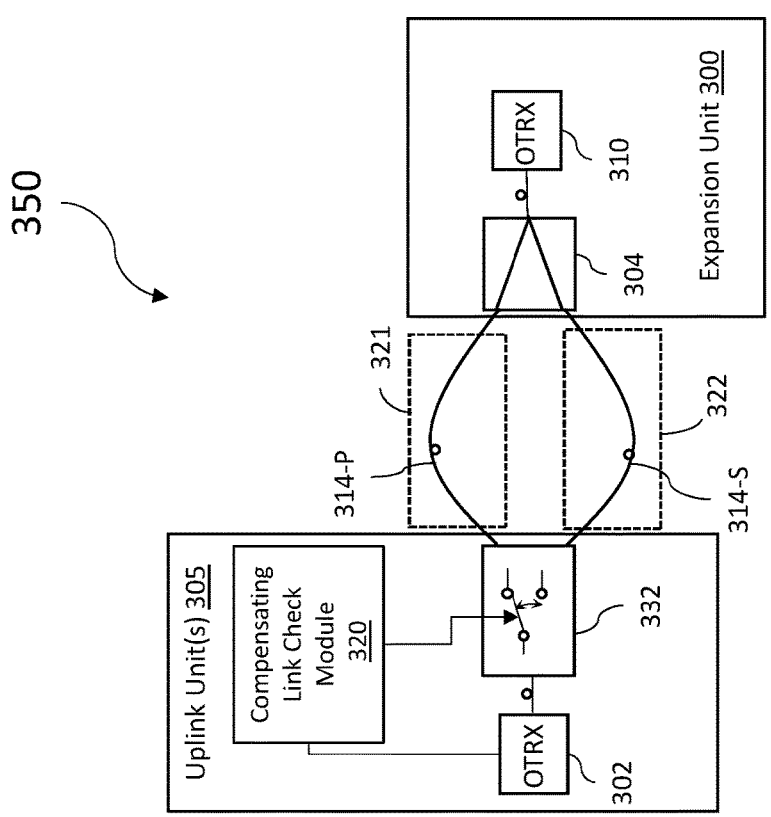

One alternate configuration of the embodiment presented in FIG. 3 is illustrated in FIG. 3A at 350, where one or both of the compensating link check module 320 and switch 332 may be located in the unit 305 and the splitter-combiner 304 relocated to the expansion unit 300. In operation, as opposed to the unit 305 always providing a downlink signal on both cables 314-P and 314-S and the switch 332 in the expansion unit 300 selecting which one is coupled to the optical transceiver interface 310, instead the remote unit optical transceiver interface 310 is continuously coupled to both cables 314-P and 114-S and the switch 332 (under control of the compensating link check module 320) selects which of the cables 314-P and 314-S becomes energized. Otherwise, these components operate together in the same manner to perform link checks of the secondary cable 314-S, while reconfiguring compensation attenuator settings, as set forth in any of the above disclosed examples.

Figure 4:
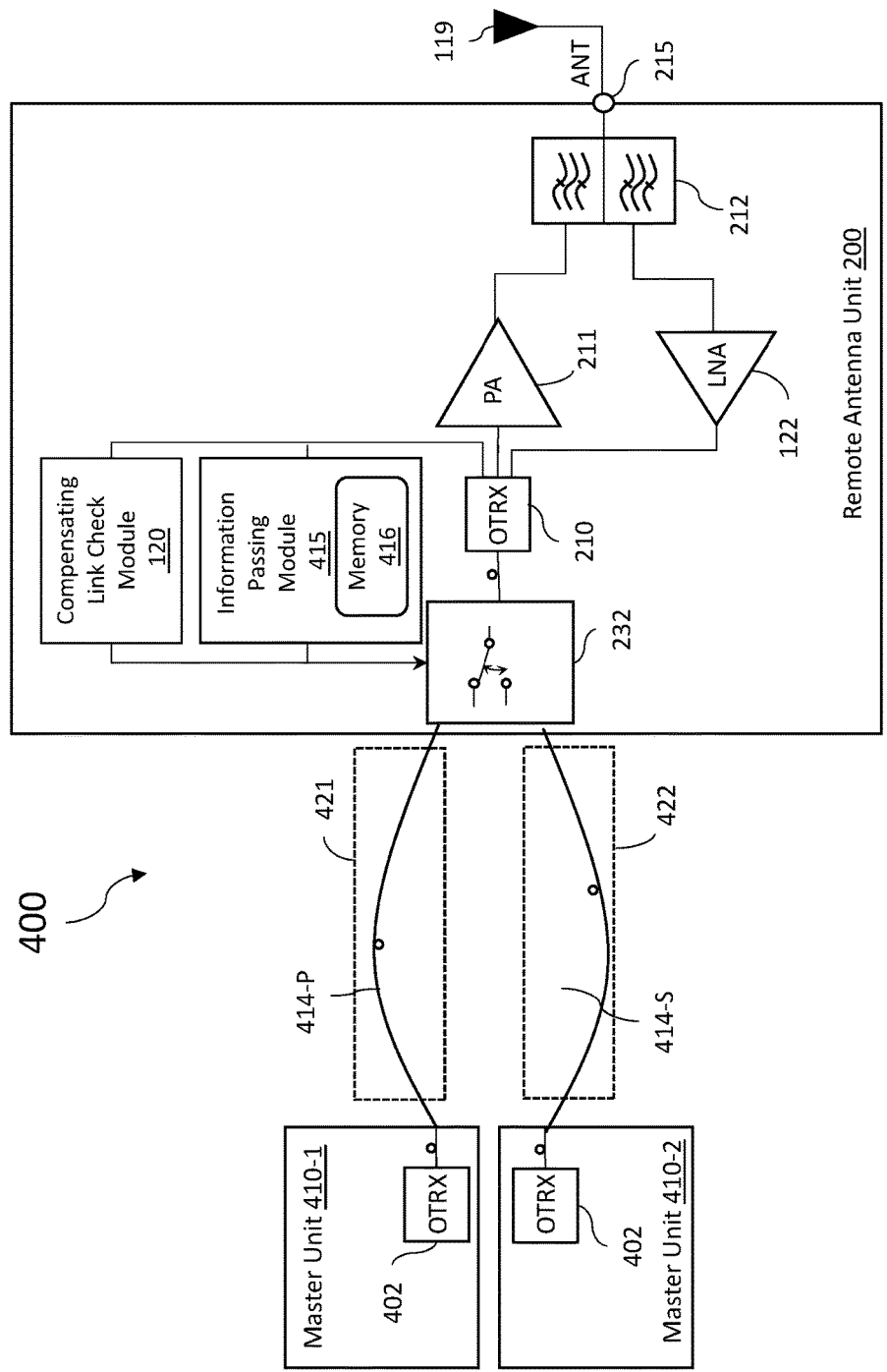
FIG. 4 is a block diagram illustrating another example embodiment of the present disclosure.

FIG. 4 illustrates generally at 400 another implementation of an example embodiment utilizing the remote unit 200 described above with respect to FIG. 2. In this case, the remote antenna unit 200 is coupled to two master units 410-1 and 410-2 rather than a single master unit as was the case in FIG. 2. As shown in FIG. 4, the master unit 410-1 communicates with the remote unit 200 via the primary cable 414-P while the master unit 410-2 communicates with the remote unit 200 via the secondary cable 414-S. It should be understood that elements shown in FIG. 4 may be used in conjunction with, in combination with, or substituted for elements of any of the embodiments discussed herein and vice versa. Further, it should be understood that the functions, structures and other description of elements for embodiments described herein may apply to like named or described elements in any of the other figures and vice versa.

The primary, or main cable 414-P is laid along a first path 421 while the secondary, or substitute cable 414-S is laid along a second path 422 that is physically separated from the first path 42. For example, the first path 421 may comprise a first set of rooms, corridors, hallways, tunnels, cable trays, etc., that are completely distinct from those of the second path 422. In this way, if there is a fire, structural collapse, or other catastrophic event along the first path 421 that damages the primary cable 414-P, the physical separation of the second path 422 from the first path 421 may allow the secondary cable 414-S to survive and remain functional. In this embodiment, As is evident from FIG. 4, under normal conditions when the primary cable 414-P is in service, the second master unit 410-2 is decoupled from the remote antenna unit 200 because the switch 232 is positioned to couple the primary cable 414-P to optical transceiver interface 210 rather than the secondary cable 414-S. There is thus no mechanism in this switch state for the second master unit 410-2 to retrieve status or signaling information from this remote antenna unit 200.

Moreover, during normal operation the intermittent link check is the only time during which the second master unit 410-2 is coupled to the remote antenna unit 200. Unfortunately, the controller 130 of the second master unit 410-2 controller might not be able to exploit this intermittent connection to exchange information data available at the remote antenna unit 200. This is because normally each master unit in a DAS controls multiple remote antenna units 200 via separate optical transceiver interfaces devices so there is some delay time in communicating with the underlying components. As a result, the second master unit 410-2 is likely to miss the link check event as an opportunity exchange information data over the secondary cable 414-S connection.

In the embodiment shown in FIG. 4, therefore, the remote antenna unit 200 further includes an information passing module 415 that may function independent of, or in cooperation with the compensating line check module 120. In addition to further including the information passing module 420, in FIG. 4 the optical transceiver interface 402 is leveraged to exploit the intermittent connections that may exists over the secondary cable 414-S connection, for example during the periods where link checks are initiated by the compensating link check module 120.

The information passing module 415, the various features described here as being implemented by information passing module 415, and/or portions thereof, can be implemented by circuits comprising electronics in combination with for example, control circuitry and/or code executed by a processor, in a field programmable gate array (FPGA), an application specific integrated circuit (ASIC), or the like. In some embodiments, the information passing module 415 may be implemented with electronics responsive to signals from the remote unit controller 130. In some embodiments, the information passing module 415 may be integrated with the compensating link check module 120. In some embodiments, the information passing module 415 may be implemented at least in part as a software application executed by the controller 130. In this embodiment, the information passing module 415 coordinates the information exchange between master units 410-1 and 410-2. This exchange of information may be from the master unit 410-1 to the master unit 410-2 when the main path 414-P is in operation. Alternatively, the exchange of information may be from the master unit 410-2 to the master unit 410-1 when the substitute path 414-S is in operation. As such, the description of exchanging information between master units provided herein should be understood to be applicable to either configuration.

To facilitate the exchange of information, the information passing module 420 includes a memory 416 where data received from the master unit that originated the data exchange request is temporarily deposited until it is transmitted to the optical transceiver interface 402 of the receiving master unit.

The optical transceiver interface 402 of the receiving master unit (for this illustrative example, the second master unit 410-2) is configured to function as a "proxy" for the second master unit 410-2 regarding the data exchange. Relevant data received from the remote antenna unit 200 over the momentary secondary cable 414-S connection is stored in the memory 243 of the optical transceiver interface 402. The type of information conveyed during this time period is not necessarily limited to any particular type of information, but may include for example, status messages, management messages, setting information, commands and/or external information entered from an operator control panel (OCP) 131. This information may be temporarily stored in memory 243 of the optical transceiver interface and then forwarded upon the request of the master unit's controller 130. It should be noted that this would work in the equivalent manner in the reverse configuration where the system is operating over 414-S and information is begin exchanged towards the first master unit 410-1.

As an example, FIG. 5 is a flow chart illustrating an example method embodiment used in conjunction with the configuration shown in FIG. 4 to share a set of management data that comprises status, settings, or other DAS management information from the first master unit 410-1 to the second master unit 410-2 during times of normal operation where primary cable 414-P is in active service between the first master unit 410-1 and the remote unit 200. The method begins at 510 where the first master unit 410-1 forwards a set of data to the remote antenna unit 200 via primary cable 414-P.

In one embodiment, to initially forward the set of management data from a master unit to the remote antenna unit 200, the management data may be combined with wireless service DAS data in one of various ways that would be known to those skilled in the art for transporting management data along with wireless service data in a DAS. For example, the set of management data in method 500 may be communicated via a control channel established on primary and/or secondary cables 414-P and 414-S separate from data channels carrying wireless service DAS data. In that case, the data may be formatted as Ethernet data. In some embodiments, this control channel may be implemented as a separate RF channel outside of the cell frequency ranges that is frequency combined (FDM) with the service RF signals using frequency division multiplexing (FMD). In other embodiments, the control channel may be implemented in management/control time slots of synchronous frames (where synchronous digital links are used) or in management packets if an asynchronous packet based transport is used. Such alternative schemes are provided as examples only and not intended to limit the scope of this disclosure or exclude the various other schemes that can be used.

The method proceeds to 520 where the controller 130 of the remote antenna unit decodes the set of data and temporarily stores it in memory 416 of the information passing module 415. The method then proceeds to 530 where the controller 130 prompts the information passing module 415 to initiate a toggle of the switch 232 from the primary cable 414-P to the secondary cable 414-S. This toggle of the switch 232 to initiate information passing may be performed in conjunction with a link check initiation performed by the compensating link check module 120, but that need not necessarily be the case.

In one embodiment when the information passing is initiated, the compensating link check module 120 and/or information passing module 415 may also signals the optical transceiver interface 210 to load the set of calibration settings for the secondary cable 414-S from the stored compensation settings 244 so that when the signal from the secondary cable 414-S is received by the optical transceiver interface module 210, the downlink compensation attenuator 241 and uplink compensation attenuator 242 are using the calibration settings associated with the secondary cable 414-S.

The method proceeds to 540 where the second master unit 410-2 detects activation of the secondary cable 414-S by detecting the reception of an uplink communication signal at its optical transceiver interface 402 and to 550 with receiving the set of data originating from the first master unit 410-1 and storing the set of data in the memory of the optical transceiver interface 402. As previously described, the information passing module 415 completes the information passing by controlling the switch 232 to toggle the switch 232 from the secondary cable 414-S back to the primary cable 414-P. In one embodiment, the compensating link check module 120 and/or information passing module 415 also signals the optical transceiver interface 210 to reload the set of calibration settings for the primary cable 414-P from the stored compensation settings 244 so that when the signal from the primary cable 414-P is again received by the optical transceiver interface module 210, the downlink compensation attenuator 241 and the uplink compensation attenuator 242 are using the calibration settings associated with the primary cable 414-P. The method proceeds to 560 where the controller 130 of the second master unit 410-2 periodically polls the optical transceiver interface 402 for any incoming data sets in the memory 243 of the optical transceiver interface 402. When a set of data is present, it is transferred to the controller 130.

In one alternate implementation, the remote antenna unit 200 may have a set of data to share with the second master unit 410-2 that does not originate from the first master unit 410-1. In that case, the method 500 may be performed beginning at block 530 rather than 510.

It should be appreciated that in addition to the example embodiments described herein, other network architectures may be implemented that still functionally operate in the same manner as described in any of the embodiments disclosed herein. It should also be understood that for any of the embodiments described herein, while the communication links connecting master units and remote antenna units may comprise optical fiber, in other embodiments other wired or wireless communication links, or combinations thereof, may be utilized instead of, or in combination with, optical fiber communication links.

As used herein, DAS related terms such as "master unit", "remote unit", "remote antenna unit", "control unit", "optical transceiver interface" refer to hardware elements that would be immediately recognized and understood by those of skill in the art of wireless communications and are not used herein as nonce words or nonce terms for the purpose of invoking 35 USC 112(f).

Example Embodiments

Example 1 includes a distributed antenna system, the system comprising: at least one master unit configured to receive a base station downlink radio frequency signal and to transmit a base station uplink radio frequency signal; at least one remote antenna unit that is communicatively coupled via a switch to the at least one master unit by a primary cable and a secondary cable both coupled to the switch, the remote antenna unit comprising a power amplifier and configured to radiate a remote downlink radio frequency signal from at least one antenna associated with the remote antenna unit, the remote antenna unit further configured to receive a remote uplink radio frequency signal from at least one antenna associated with the remote antenna unit; and a compensating link check module that outputs a control signal to the switch, wherein the switch selects between the primary cable and the secondary cable in response to the control signal; wherein the compensating link check module is configured to control the switch to momentarily select the secondary cable to perform a link check of the secondary cable, wherein during the link check of the secondary cable the remote unit measures at least one quality metric of a downlink signal received from the at least one master unit via the secondary cable; and wherein upon initiation of the link check of the secondary cable, the compensating link check module adjusts an attenuation of the downlink signal received on the secondary cable by loading a set of calibration settings for the secondary cable into a downlink compensation attenuator.

Example 2 includes the system of example 1, wherein upon completion of the link check of the secondary cable, the compensating link check module loads a set of calibration settings for the primary cable into the downlink compensation attenuator and controls the switch to reselect the primary cable.

Example 3 includes the system of example 2, wherein upon completion of the link check of the secondary cable, the compensating link check module reports a result of measuring the at least one quality metric to the at least one master unit via the primary cable.

Example 4 includes the system of any of examples 1-3, wherein the switch and compensating link check module are components within the remote antenna unit.

Example 5 includes the system of any of examples 1-4, wherein the switch and compensating link check module are components within the at least one master unit.

Example 6 includes the system of any of examples 1-5, wherein the at least one master unit comprises a first master unit coupled to both the primary cable and a secondary cable via a splitter-combiner.

Example 7 includes the system of any of examples 1-6, wherein the at least one master unit comprises a first master unit coupled to the primary cable and a second master unit coupled to the secondary cable.

Example 8 includes the system of example 7, wherein the remote antenna unit is configured to transmit a set of data received from the first master unit coupled via the primary cable to the second master unit via the secondary cable during a period when the switch is controlled to momentarily select the secondary cable.

Example 9 includes the system of any of examples 1-8, wherein the remote antenna unit is configured to transmit a set of data to the second master unit via the secondary cable during a period when the switch is controlled to momentarily select the secondary cable.

Example 10 includes the system of any of examples 1-9, wherein the compensating link check module initiates the link check based on a recurring schedule.

Example 11 includes the system of any of examples 1-10, wherein the compensating link check module receives management data and initiates the link check in response to the management data.

Example 12 includes the system of any of examples 1-11, wherein the primary cable comprises a primary optical fiber cable, the secondary cable comprises a secondary optical fiber cable and the switch comprises an optical switch; wherein the remote antenna unit further comprises an optical transceiver interface coupled to the optical switch.

Example 13 includes the system of example 12 wherein the optical transceiver interface comprises the downlink compensation attenuator and a memory; wherein the memory stores the set of calibration settings for the secondary cable and further stores a set calibration settings for the primary cable; wherein the optical transceiver interface loads the set of calibration settings for the secondary cable to the downlink compensation attenuator in response to a signal from the compensating link check module indicating that the link check is initiated; and wherein the optical transceiver interface loads the set of calibration settings for the primary cable to the downlink compensation attenuator in response to a signal from the compensating link check module indicating that the link check is complete.

Example 14 includes the system of any of examples 12-13, wherein the at least one master unit comprises a second optical transceiver interface coupled to the secondary cable; wherein the second optical transceiver interface comprises a memory configured to store a set of data received via the secondary cable during performance of the link check; and wherein the second optical transceiver interface is configured to forward the set of data from the memory in response to a polling signal received from a master unit controller.

Claim 15 includes a method for redundancy link checks for a distributed antenna system comprising at least one master unit and at least one remote antenna unit that is communicatively coupled via a switch to the at least one master unit by a primary cable and a secondary cable both coupled to the switch, the method comprising generating a control signal from a compensating link check module to initiate a redundancy link check; controlling the switch with the control signal to momentarily select the secondary cable to perform a link check of the secondary cable; measuring at least one quality metric of a downlink signal received from the at least one master unit via the secondary cable during the link check; adjusting an attenuation of the downlink signal received on the secondary cable by loading a set of calibration settings for the secondary cable into a downlink compensation attenuator; and upon completion of the link check of the secondary cable, reporting a result of measuring the at least one quality metric to the at least one master unit via the primary cable.

Example 16 includes the method of example 15 further comprising: upon completion of the link check of the secondary cable, applying a set of calibration settings for the primary cable into the downlink compensation attenuator; and controlling the switch to reselect the primary cable.

Example 17 includes the method of any of examples 15-16, wherein the switch and compensating link check module are components within the remote antenna unit.

Example 18 includes the method of any of examples 15-17, wherein the switch and compensating link check module are components within the at least one master unit.

Example 19 includes the method of any of examples 15-18, wherein the at least one master unit comprises a first master unit coupled to both the primary cable and a secondary cable via a splitter-combiner.

Example 20 includes the method of any of examples 15-19, wherein the at least one master unit comprises a first master unit coupled to the primary cable and a second master unit coupled to the secondary cable.

Example 21 includes the method of any of examples 15-20, wherein the compensating link check module initiates the link check based on a recurring schedule.

Example 22 includes the method of any of examples 15-21, wherein the compensating link check module receives management data and initiates the link check in response to the management data.

Example 23 includes the method of any of examples 15-22, wherein the primary cable comprises a primary optical fiber cable, the secondary cable comprises a secondary optical fiber cable and the switch comprises an optical switch; and wherein the remote antenna unit further comprises an optical transceiver interface coupled to the optical switch.

Example 24 includes a method for communicating a set of data between components of a digital antenna system comprising at least a first master unit, a second master unit, and a remote antenna unit that is communicatively coupled via a switch to the first master unit by a primary cable and to the second master unit by the secondary cable, the method comprising: controlling the switch to switch from the primary cable to the secondary cable in response to a control signal from an information passing module; detecting a reception of an uplink optical communication signal at the second master unit from the secondary cable; receiving a set of data at an optical transceiver interface coupled to the secondary cable and storing the set of data in a memory of the optical transceiver interface; and transferring the set of data to a master unit controller of the second master unit in response to a polling signal received from the master unit controller.

Example 25 includes the method of example 24, further comprising: forwarding the set of data from the first master unit to the remote antenna unit via the primary cable prior to controlling the switch to switch from the primary cable to the secondary cable; and decoding the set of data at the remote antenna unit; and wherein a second master unit comprises the optical transceiver interface coupled to the secondary cable.

In various alternative embodiments, system and/or device elements, method steps, or example implementations described throughout this disclosure (such as any of the master units, remote antenna units, information passing module, compensating Link check module, controllers, circuitry, control units or sub-parts thereof, for example) may be implemented at least in part using one or more computer systems, field programmable gate arrays (FPGAs), or similar devices comprising a processor coupled to a memory and executing code to realize those elements, processes, or examples, said code stored on a non-transient data storage device. Therefore other embodiments of the present disclosure may include elements comprising program instructions resident on computer readable media which when implemented by such computer systems, enable them to implement the embodiments described herein. As used herein, the term "computer readable media" refers to tangible memory storage devices having non-transient physical forms. Such non-transient physical forms may include computer memory devices, such as but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device having a physical, tangible form. Program instructions include, but are not limited to computer-executable instructions executed by computer system processors and hardware description languages such as Very High Speed Integrated Circuit (VHSIC) Hardware Description Language (VHDL).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A distributed antenna system, the system comprising:
   at least one master unit configured to receive a base station downlink radio frequency signal and to transmit a base station uplink radio frequency signal;
   at least one remote antenna unit that is communicatively coupled via a switch to the at least one master unit by a primary cable and a secondary cable both coupled to the switch, the remote antenna unit comprising a power amplifier and configured to radiate a remote downlink radio frequency signal from at least one antenna associated with the remote antenna unit, the remote antenna unit further configured to receive a remote uplink radio frequency signal from at least one antenna associated with the remote antenna unit; and
   a compensating link check module that outputs a control signal to the switch, wherein the switch selects between the primary cable and the secondary cable in response to the control signal;
   wherein the compensating link check module is configured to control the switch to momentarily select the secondary cable to perform a link check of the secondary cable, wherein during the link check of the secondary cable the remote unit measures at least one quality metric of a downlink signal received from the at least one master unit via the secondary cable; and
   wherein upon initiation of the link check of the secondary cable, the compensating link check module adjusts an attenuation of the downlink signal received on the secondary cable by loading a set of calibration settings for the secondary cable into a downlink compensation attenuator.

2. The system of claim 1, wherein upon completion of the link check of the secondary cable, the compensating link check module loads a set of calibration settings for the primary cable into the downlink compensation attenuator and controls the switch to reselect the primary cable.

3. The system of claim 2, wherein upon completion of the link check of the secondary cable, the compensating link check module reports a result of measuring the at least one quality metric to the at least one master unit via the primary cable.

4. The system of claim 1, wherein the switch and compensating link check module are components within the remote antenna unit.

5. The system of claim 1, wherein the switch and compensating link check module are components within the at least one master unit.

6. The system of claim 1, wherein the at least one master unit comprises a first master unit coupled to both the primary cable and a secondary cable via a splitter-combiner.

7. The system of claim 1, wherein the at least one master unit comprises a first master unit coupled to the primary cable and a second master unit coupled to the secondary cable.

8. The system of claim 7, wherein the remote antenna unit is configured to transmit a set of data received from the first master unit coupled via the primary cable to the second master unit via the secondary cable during a period when the switch is controlled to momentarily select the secondary cable.

9. The system of claim 1, wherein the remote antenna unit is configured to transmit a set of data to the second master unit via the secondary cable during a period when the switch is controlled to momentarily select the secondary cable.

10. The system of claim 1, wherein the compensating link check module initiates the link check based on a recurring schedule.

11. The system of claim 1, wherein the compensating link check module receives management data and initiates the link check in response to the management data.

12. The system of claim 1, wherein the primary cable comprises a primary optical fiber cable, the secondary cable comprises a secondary optical fiber cable and the switch comprises an optical switch;
wherein the remote antenna unit further comprises an optical transceiver interface coupled to the optical switch.

13. The system of claim 12 wherein the optical transceiver interface comprises the downlink compensation attenuator and a memory;
wherein the memory stores the set of calibration settings for the secondary cable and further stores a set calibration settings for the primary cable;
wherein the optical transceiver interface loads the set of calibration settings for the secondary cable to the downlink compensation attenuator in response to a signal from the compensating link check module indicating that the link check is initiated; and
wherein the optical transceiver interface loads the set of calibration settings for the primary cable to the downlink compensation attenuator in response to a signal from the compensating link check module indicating that the link check is complete.

14. The system of claim 12, wherein the at least one master unit comprises a second optical transceiver interface coupled to the secondary cable;
wherein the second optical transceiver interface comprises a memory configured to store a set of data received via the secondary cable during performance of the link check; and
wherein the second optical transceiver interface is configured to forward the set of data from the memory in response to a polling signal received from a master unit controller.

15. A method for redundancy link checks for a distributed antenna system comprising at least one master unit and at least one remote antenna unit that is communicatively coupled via a switch to the at least one master unit by a primary cable and a secondary cable both coupled to the switch, the method comprising:
generating a control signal from a compensating link check module to initiate a redundancy link check;
controlling the switch with the control signal to momentarily select the secondary cable to perform a link check of the secondary cable;
measuring at least one quality metric of a downlink signal received from the at least one master unit via the secondary cable during the link check;
adjusting an attenuation of the downlink signal received on the secondary cable by loading a set of calibration settings for the secondary cable into a downlink compensation attenuator; and upon completion of the link check of the secondary cable, reporting a result of measuring the at least one quality metric to the at least one master unit via the primary cable.

16. The method of claim 15, further comprising:
upon completion of the link check of the secondary cable, applying a set of calibration settings for the primary cable into the downlink compensation attenuator; and
controlling the switch to reselect the primary cable.

17. The method of claim 15, wherein the switch and compensating link check module are components within the remote antenna unit.

18. The method of claim 15, wherein the switch and compensating link check module are components within the at least one master unit.

19. The method of claim 15, wherein the at least one master unit comprises a first master unit coupled to both the primary cable and a secondary cable via a splitter-combiner.

20. The method of claim 15, wherein the at least one master unit comprises a first master unit coupled to the primary cable and a second master unit coupled to the secondary cable.

21. The method of claim 15, wherein the compensating link check module initiates the link check based on a recurring schedule.

22. The method of claim 15, wherein the compensating link check module receives management data and initiates the link check in response to the management data.

23. The method of claim 15, wherein the primary cable comprises a primary optical fiber cable, the secondary cable comprises a secondary optical fiber cable and the switch comprises an optical switch; and
wherein the remote antenna unit further comprises an optical transceiver interface coupled to the optical switch.

24. A method for communicating a set of data between components of a digital antenna system comprising at least a first master unit, a second master unit, and a remote antenna unit that is communicatively coupled via a switch to the first master unit by a primary cable and to the second master unit by the secondary cable, the method comprising:
controlling the switch to switch from the primary cable to the secondary cable in response to a control signal from an information passing module;
detecting a reception of an uplink optical communication signal at the second master unit from the secondary cable;
receiving a set of data at an optical transceiver interface coupled to the secondary cable and storing the set of data in a memory of the optical transceiver interface; and
transferring the set of data to a master unit controller of the second master unit in response to a polling signal received from the master unit controller.

25. The method of claim 24, further comprising:
forwarding the set of data from the first master unit to the remote antenna unit via the primary cable prior to controlling the switch to switch from the primary cable to the secondary cable; and
decoding the set of data at the remote antenna unit; and
wherein a second master unit comprises the optical transceiver interface coupled to the secondary cable.

* * * * *